US006633220B2

(12) United States Patent
Inoue et al.

(10) Patent No.: US 6,633,220 B2
(45) Date of Patent: Oct. 14, 2003

(54) COIL APPARATUS AND MANUFACTURING METHOD FOR THE SAME

(75) Inventors: Keiji Inoue, Yokohama (JP); Tsutomu Ishige, Machida (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/885,084

(22) Filed: Jun. 20, 2001

(65) Prior Publication Data
US 2001/0054946 A1 Dec. 27, 2001

(30) Foreign Application Priority Data
Jun. 20, 2000 (JP) ........................ 2000-184827
Jul. 11, 2000 (JP) ........................ 2000-210054

(51) Int. Cl.[7] .............................................. H01F 5/00
(52) U.S. Cl. .................... 336/200; 336/83; 336/183; 336/192; 336/200; 336/223; 336/232
(58) Field of Search ................. 336/200, 223, 336/232, 83, 183, 192

(56) References Cited
U.S. PATENT DOCUMENTS
6,028,500 A * 2/2000 Buist ........................ 336/100

FOREIGN PATENT DOCUMENTS
DE 3620762 12/1987
DE 003620762 A1 * 12/1987

* cited by examiner

Primary Examiner—Elvin Enad
Assistant Examiner—Jennifer A. Poker
(74) Attorney, Agent, or Firm—Keating & Bennett, LLP

(57) ABSTRACT

To prevent a substrate for mounting electronic components from being damaged when cores are rubbed together during assembly, a pair of core members sandwich a part of a coil pattern formed on the substrate from the top and bottom sides of the substrate, and the core members are held together by a core-combining member. A cover member is fixed to the substrate to cover the upper side of the core-combining member. Inclined ribs on the cover member raise the core-combining member by abutting against external inclined fates of leg portions of the core-combining member. A clearance thereby is formed between internal faces of a top bar portion of each core member and a surface of the substrate.

10 Claims, 5 Drawing Sheets

COIL APPARATUS AND MANUFACTURING METHOD FOR THE SAME

CROSS-REFERENCE TO RELATED APPLICATION

This is related to Ser No. 09/885,883 filed on even date herewith, titled COIL APPARATUS AND MANUFACTURING METHOD FOR THE SAME, the disclosure of which is incorporated by reference herein.

BACKGROUND OF THE INVENTION

1. Field of the Invention

The present invention relates to a coil apparatus for use as a transformer or a choke coil, for example, and to a method for manufacturing the coil apparatus.

2. Description of the Related Art

FIG. 5A is an exploded view of a conventional of a coil apparatus; FIG. 5B is a sectional view of the coil apparatus shown in FIG. 5A at the line A—A. A coil apparatus 1 shown in FIGS. 5A and 5B comprises a substrate 2 for mounting electronic components thereon, a coil pattern 3 formed on the substrate 2, a core 4 comprised of a pair of core members 4a and 4b, and a core-combining member 5.

The substrate 2 having electronic components and a circuit pattern mounted thereon, which form a circuit, is preferably a multilayer substrate formed by joining plural substrates together. For example, the plural substrates which form the substrate 2 may respectively have coil patterns 7 coaxially formed about an axis defined on the substrate 2. The coil pattern 3 is formed by connecting a plurality of the coil patterns 7. In addition, when the coil apparatus 1 is to be a transformer apparatus, at least one of the plural coil patterns 7 forms a primary coil and the remaining coil patterns 7 form one or more secondary coils.

In the example shown in FIGS. 5A and 5B, the core members 4a and 4b are molded by pressing and sintering magnetic powder such as ferrite, and are E-shaped in cross-section, each having a planar bar portion 8 and core legs 9a, 9b, and 9c arranged to respectively extend from one end, the center, and the other end of the bar portion 8.

The substrate 2 is provided with through-holes 10a, 10b, and 10c for receiving the core legs 9a, 9b, and 9c, respectively. The through-hole 10b is formed within the coil pattern 3. Into these through-holes 10a, 10b, and 10c, as shown in FIG. 5B, the core legs 9a, 9b, and 9c of the core members 4a and 4b are respectively inserted from top and bottom surfaces of the substrate 2, so that the core legs 9a, 9b, and 9c of the core member 4a on the top side respectively abut the core legs 9a, 9b, and 9c of the core member 4b on the bottom side.

The core-combining member 5, as is shown in FIG. 5B, is disposed surrounding the pair of core members 4a and 4b and elastically holds them together. The core-combining member 5 is made by bending a metallic plate so as to form a web 12, leg portions 13a and 13b, and claw portions 14a and 14b. That is, the two sides of the web 12 covering the bar portion 8 of the core member 4a are respectively bent in the direction along the core legs 9a and 9c of the core members 4a and 4b so as to form the leg portions 13a and 13b; and the ends of the leg portions 13a and 13b are further bent inwardly so as to form the claw portions 14a and 14b.

The space between the web 12 and the claw portions 14a and 14b, as is shown in FIG. 5B, is approximately the same as the distance h from the top surface 8a of the bar portion 8 of the core member 4a to the top surface 8a of the bar portion 8 of the core member 4b when the core legs 9 of the core member 4a on the top side are abutted with the core legs 9 of the core member 4b on the bottom side. As is shown in FIG. 5B, the web 12 and the claw portions 14a and 14b clamp the bilateral sides of the core members 4a and 4b in the abutment state from both sides and from the top and bottom sides. Thereby, the core members 4a and 4b are combined together so as to be relatively movable in the direction α (front-and-rear) indicated in FIG. 5A. The through-holes 10a, 10b, and 10c have the length W in the front-to-rear direction, along which the core members 4a and 4b can move in the front-to-rear direction as mentioned above.

The coil apparatus 1 shown in FIGS. 5A and 5B is assembled as follows: First, the core member 4a is arranged above the substrate 2 on which the coil pattern section 3 and the through-holes 10a, 10b, and 10c are formed while the core member 4b is arranged below the substrate 2. The core legs 9a, 9b, and 9c of the top core member 4a are inserted into corresponding through-holes 10a, 10b, and 10c from the top of the substrate 2 while similarly, the core legs 9a, 9b, and 9c of the bottom core member 4b are inserted into the corresponding through-holes 10a, 10b, and 10c from the bottom of the substrate 2. Thus, the core legs 9a, 9b, and 9c of the top core member 4a are abutted against the core legs 9a, 9b, and 9c of the bottom core member 4b, respectively.

From the upper side of the core members 4a and 4b in the abutment state, the left leg portion 13a of the core-combining member 5 is inserted into the left through-hole 10a while the right leg portion 13b of the core-combining member 5 is inserted into the right through-hole 10c, the through-holes 10a and 10c respectively corresponding to the outward core legs 9a and 9c of the core members 4a and 4b.

Thereby, the core members 4a and 4b in the abutment state and the core-combining member 5 are fitted with each other so that the core members 4a and 4b are assembled to the substrate 2 by being combined with the core-combining member 5. In such a manner, by being assembled to the substrate 2, the core members 4a and 4b sandwich a part of the coil pattern section 3 therebetween from the top and bottom sides of the substrate 2.

Then, the combined core members 4a and 4b are relatively slid in the front-to-rear direction, so that the abutment portions between the core members 4a and 4b, namely the ends of the core legs 9a, 9b, and 9c which are abutted with each other, are rubbed together. By rubbing the ends of the core legs 9a, 9b, and 9c together, the following advantages can be obtained.

Since as described above the core members 4a and 4b are molded by sintering magnetic powder, the end faces of the core legs 9a, 9b, and 9c of the core members 4a and 4b are rough, and also dust may get in between the end faces of the core legs 9a, 9b, and 9c which are abutted to each other when combining the core members 4a and 4b together. Thus, adhesion between the end faces of the core legs 9a, 9b, and 9c which are abutted to each other may be low. But by rubbing the end faces of the core legs 9a, 9b, and 9c against each other by rubbing the cores together as mentioned above, the end faces of the core legs 9a, 9b, and 9c are polished to have substantially a mirror finish, while dust which has gotten in between the end faces of the core legs 9a, 9b, and 9c is crushed and removed, thereby improving the contact between the end faces of the core legs 9a, 9b, and 9c of the top core member 4a and the end faces of the core legs 9a, 9b, and 9c of the bottom core member 4b. By contacting the core members 4a and 4b together in such a manner, inductance can be improved, thereby improving the performance of the coil apparatus.

However, in the conventional structure, as is shown in FIG. 5B, internal faces 8b of the bar portion 8 of the core member 4a are necessarily brought into contact with a surface of the substrate 2. Therefore, the surface of the substrate 2 is rubbed by the internal faces 8b of the bar portion 8 when rubbing the cores together, which may cause a protecting member such as a resist formed on the surface of the substrate 2 to be damaged or to be peeled off. Such damage to the protecting member may cause a problem, in that a circuit pattern such as copper formed on the substrate 2 may corrode or its withstand-voltage performance may be reduced when the coil apparatus is placed under high-humidity circumstances for a long time.

SUMMARY OF THE INVENTION

The present invention solves the above-described problem and provides a coil apparatus and a method of manufacturing the coil apparatus, which is capable of avoiding damage to a protecting member formed on a surface of a substrate for mounting electronic components due to the movement of core members when the core members are rubbed together during the assembly of the coil apparatus, so as to improve reliability.

In order to achieve this, the present invention provides several structures which solve the above-described problems. For example, a coil apparatus according to a first aspect of the present invention comprises a substrate for mounting electronic components; a coil pattern formed on the substrate; a pair of core members mounted on the coil pattern so as to sandwich a part of the coil pattern therebetween from the top and bottom sides of the substrate, at least one of the pair of core members having core legs; through-holes for receiving the core legs formed in a portion of the substrate at the center of the coil pattern and in a portion of the substrate outside the coil pattern; a core-combining member for holding the pair of core members together, so that the core members are movable with respect to each other in front and rear directions, by clamping both the core member on the top-face side of the substrate and the core member on the bottom-face side of the substrate from the top and bottom sides of the substrate via the through-holes; and a cover member arranged to be fixed to the substrate, wherein the cover member has surfaces which raise and hold the core-combining member so as to separate both core members from the substrate resulting in a non-contact state, by forming a space between opposing faces of the substrate and the core members held by the core-combining member.

In a coil apparatus according to another aspect of the invention, the core-combining member may be provided with leg portions which are inserted into the through-holes on the outside, to the right and the left, of the right and left core legs, each leg portion having an inclined face formed on an external side thereof, the inclined face being inclined outwardly so as to become more distant from the core members as the inclined face proceeds from the bottom face toward the top face of the substrate; and also, the cover member may be provided with leg portions which are inserted into the same through-holes at positions outside the leg portions of the core-combining member, the leg portions of the cover member each having an inclined portion formed thereon, the inclined portions being inclined in a direction to raise the core-combining member by abutting against the inclined faces of the leg portions of the core-combining member.

A method for manufacturing a coil apparatus according to a second aspect of the present invention comprises the steps of: arranging the pair of core members, one core member on the top face of the substrate for mounting electronic components, the other on the bottom face of the substrate; securing the pair of core members together with the core-combining member so as to mount the core members on a coil pattern of the substrate; raising and holding the core-combining member with the cover member so that the cover member is fixed to the substrate and the core members are separated from the substrate for mounting electronic components resulting in a non-contact state therebetween; and sliding the core member on the top side of the substrate relative to the core member on the bottom side thereof so as to rub a contacting portion between the core member on the top side and the core member on the bottom side so that the contacting portions between the core member on the top side and the core member on the bottom side are brought into full contact.

In the structures according to the present invention, the core-combining member holding the core members together is raised and held by the cover member so as to form a clearance between opposing faces of the core member and the substrate for mounting electronic components, resulting in a non-contact state between the core member and the substrate.

Accordingly, when the cores are rubbed against each other during the assembly of the coil apparatus, the surface of the substrate for mounting electronic components can be protected from being damaged by the sliding core members. Thereby, damage to the protecting member on the top surface of the substrate due to the rubbing can be prevented so as to avoid problems such as corrosion of a circuit pattern on the substrate and withstand-voltage performance degradation. Therefore, a highly reliable coil apparatus can be provided.

The right, left, front, and rear directions mentioned in this specification are the directions which exist when the substrate for mounting electronic components is horizontally placed; however, the position of the substrate is not limited to be horizontal, and the right, left, front, and rear directions above may be different from those when actually viewing.

Other features and advantages of the present invention will become apparent from the following description of embodiments of the invention which refers to the accompanying drawings, in which like references denote like elements and parts.

DETAILED DESCRIPTION OF EMBODIMENTS OF THE INVENTION

Figure 1A:
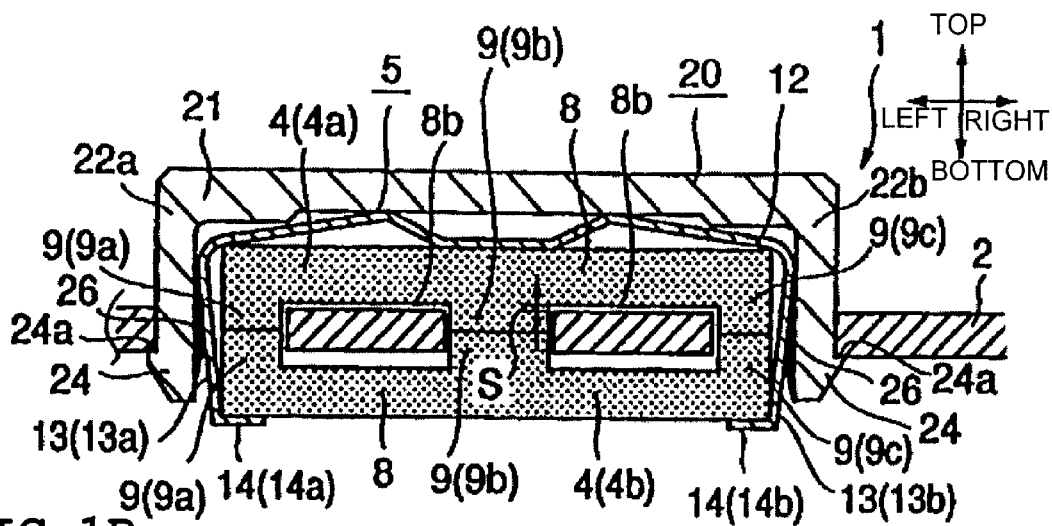
FIGS. 1A, 1B, 1C, and 1D are schematic representations of a coil apparatus according to a first embodiment of the present invention.

Embodiments according to the present invention will be described with reference to the drawings below, in which like reference characters designate like portions common to the various embodiments as well as the above-described conventional example and redundant description of the common portions is omitted.

FIG. 1A is a schematic sectional view of a coil apparatus according to a first embodiment of the present invention.

Figure 1B:
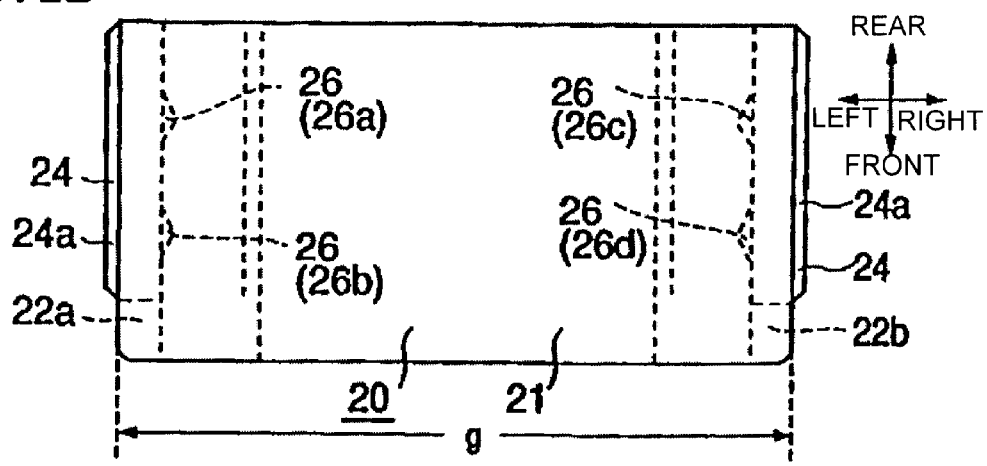
Figure 1C:
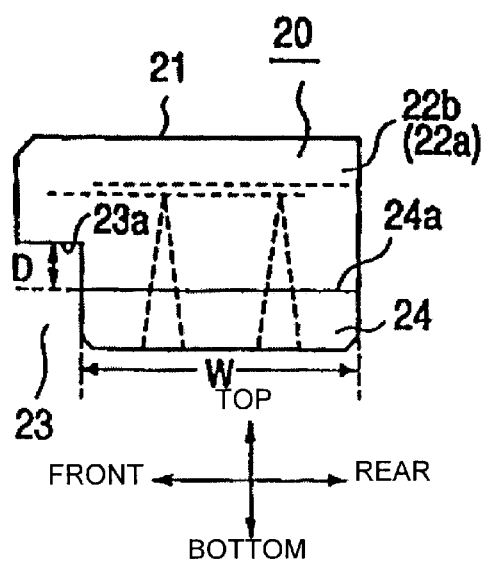

A coil apparatus 1 according to the first embodiment, similarly to the conventional example, comprises a substrate 2 for mounting electronic components thereon, a coil pattern section 3, a pair of core members 4a and 4b, a core-combining member 5, and further a cover member 20 which is specific to the first embodiment. FIG. 1B is a plan view of the cover member 20 viewed from the upper side; FIG. 1C is a schematic side view of the cover member 20.

Figure 2A:
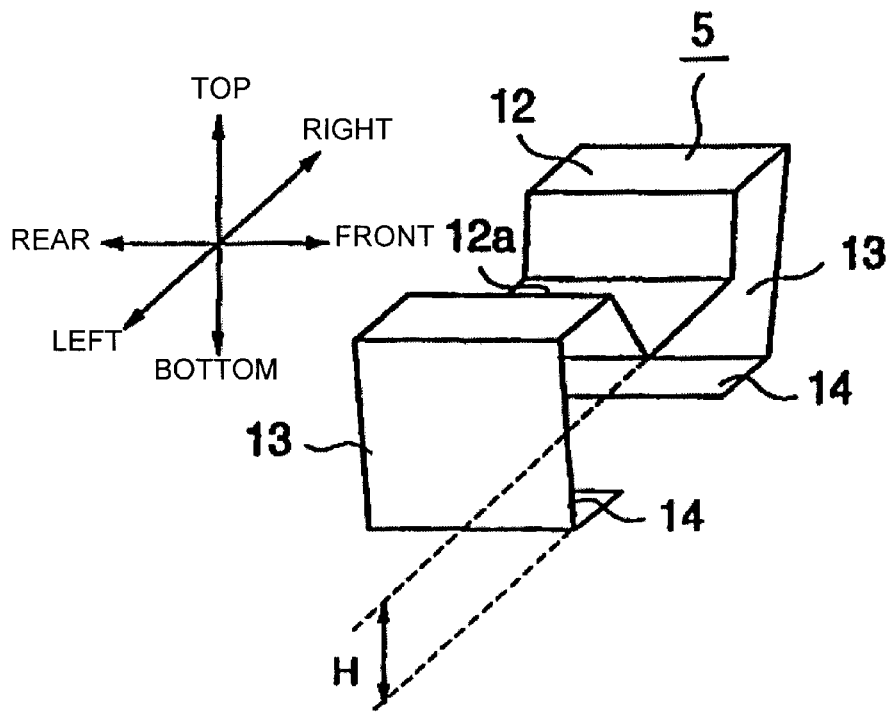
FIGS. 2A and 2B are schematic representations for showing a core-combining member forming the coil apparatus according to the first embodiment.
Figure 2B:
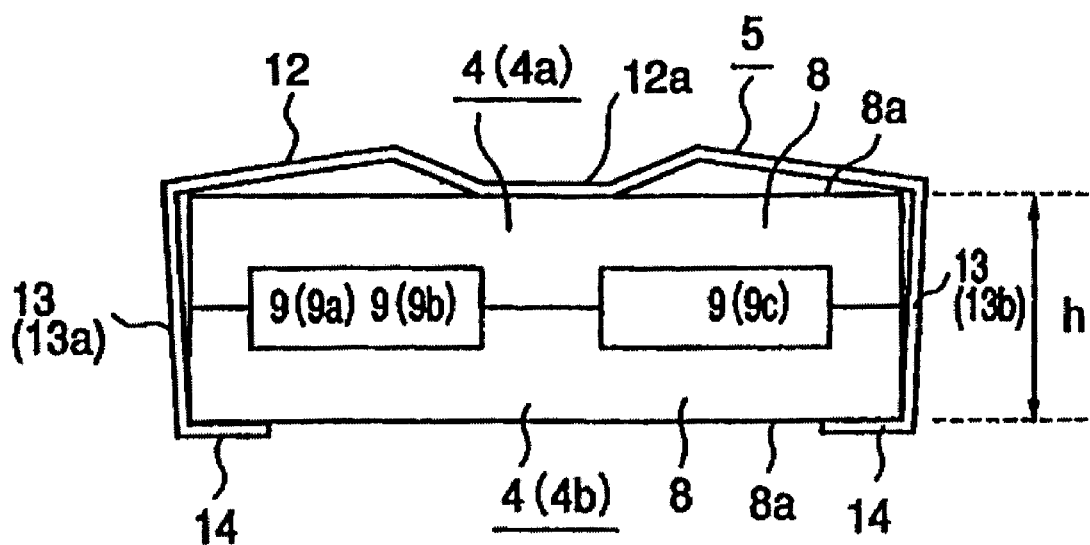

In the first embodiment, the core-combining member 5, similarly to the conventional example, is made by bending a metallic plate; however, it has a configuration different from the conventional example as shown in FIG. 2A so as to fit together with the pair of core members 4a and 4b as shown in FIG. 2B. That is, a web 12 of the core-combining member 5 is bent so as to have a depressed portion in the central part thereof in order to have elasticity; the central depressed portion of the web 12 forms a pressing portion 12a for abutting the top surface 8a of the bar portion 8 of the core member 4a so as to press the top surface 8a. The space H (FIG. 2A) between the pressing portion 12a and the claw portions 14a and 14b is slightly smaller than the distance h from the top surface 8a of the bar portion 8 of the core member 4a to the top surface 8a of the bar portion 8 of the other core member 4b as shown in FIG. 2B.

Accordingly, as is shown in FIG. 2B, when the core-combining member 5 is fitted on the core members 4a and 4b in the abutted state, the leg portions 13a and 13b of the core-combining member 5 assume an inclined position in which they are partly separated from the sides of the core members 4a and 4b, with increasing separation in the direction toward the upper side from the lower side, while the pressing portion 12a of the web 12 of the core-combining member 5 urges the core member 4a in the downward direction as seen in the drawing. The core members 4a and 4b in the abutted state are thus clamped together by the pressing portion 12a of the web 12 of the core-combining member 5 and the claw portions 14 of the core-combining member 5. In this combined state, they are relatively slidable in the front and rear directions similarly to the conventional example.

The cover member 20 which is most characteristic in the first embodiment is made from a plastic, etc.; it is fixed to the substrate 2 so as to cover the core-combining member 5 as shown in FIG. 1A; the cover member 20 is formed of a top portion 21 and leg portions 22a and 22b formed respectively extending from the two ends of the top portion 21. The leg portions 22a and 22b, as shown in FIG. 1C, are respectively provided with cut-out portions 23 on the front side so as to form substrate-abutting faces 23a. As shown in FIGS. 1A, 1B, and 1C, on the bottom outsides of the leg portions 22a and 22b, claw portions 24 are respectively formed so as to protrude outwardly.

In the first embodiment, the space D, shown in FIG. 1C, between the substrate-abutting face 23a and a substrate-abutting face 24a of the claw portion 24 is substantially the same as the substrate thickness of the substrate 2. The space g, shown in FIG. 1B, between the outside face of one leg portion 22a and the outside face of the other leg portion 22b is also substantially the same as the space G, shown in FIG. 5A, between the through-hole 10a and the through-hole 10c.

Figure 5A:
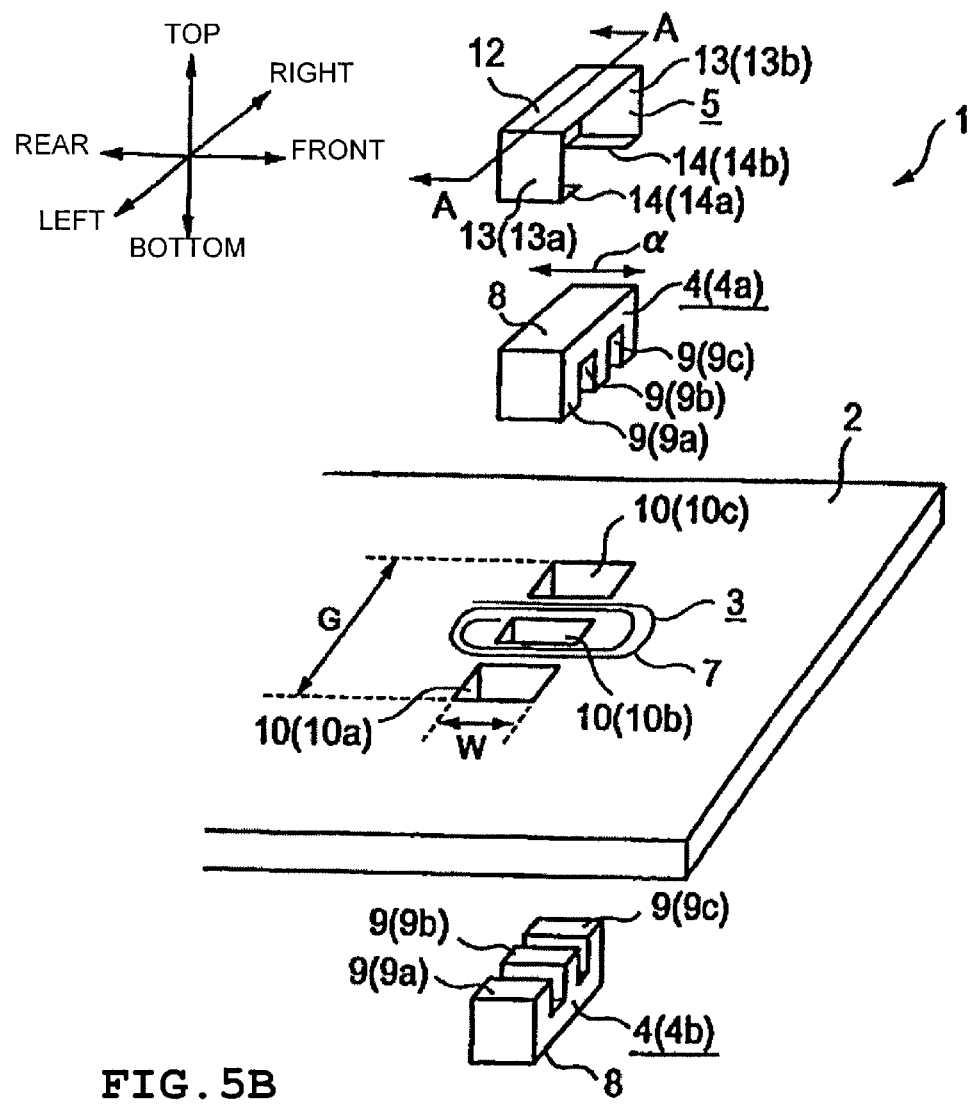
FIGS. 5A and 5B are schematic representations of a conventional example of a coil apparatus.
Figure 5B:
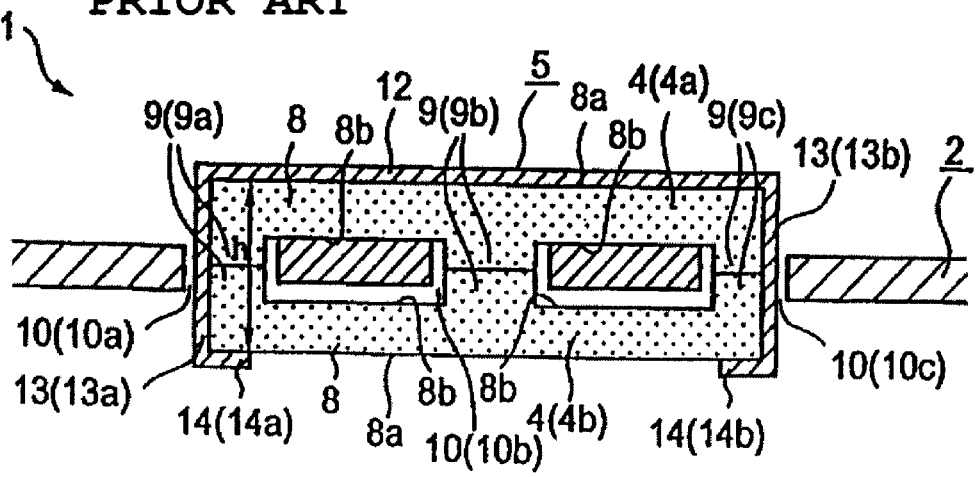

Furthermore, the length w in the front-to-rear direction of the bottom of each of the leg portions 22a and 22b shown in FIG. 1C is substantially the same as the length W in the front-to-rear direction of each of the through-holes 10a, 10b, and 10c shown in FIG. 5A.

Therefore, when the leg portions 22a and 22b of the cover member 20 are respectively inserted into the through-holes 10a and 10c from the top side of the substrate 2, the bottom sides of the leg portions 22a and 22b are bent inward into an inclined state due to the protrusion of the claw portions 24. Then, as the insertion of the leg portions 22a and 22b continues, the substrate-abutting faces 23a of the leg portions 22a and 22b come into contact with the top surface of the substrate 2, and simultaneously, the claw portions 24 pass through the through-holes 10a and 10c, and the substrate-abutting faces 24a of the claw portions 24 come into contact with the bottom surface of the substrate 2 and the bottom ends of the leg portions 22a and 22b return to their vertical position. Thereby, the substrate 2 is clamped by the substrate-abutting faces 23a and the substrate-abutting faces 24a of the claw portions 24, so that the cover member 20 is fixed tightly to the substrate 2.

On the inside faces of the leg portions 22a and 22b of the cover member 20, ribs 26 which inwardly protrude are formed. In the first embodiment, the ribs 26 have a triangular-pyramid shape as shown in perspective in FIG. 1D.

Figure 1D:
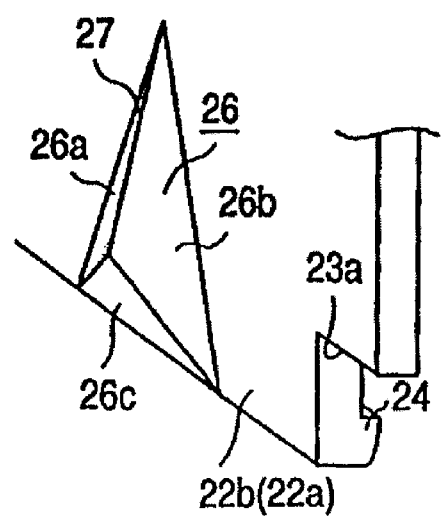

In the first embodiment, as shown in FIG. 1A, when the cover member 20 is placed on the core-combining member 5 from above an external face (inclined face) of the leg portion 13 of the core-combining member 5 abuts a boundary line 27 between a triangular face 26a and a triangular face 26b shown in FIG. 1D. The boundary line 27 is inclined so as to urge the core-combining member 5 upward, relative to the ribs 26. That is, the first embodiment is provided with an inclined portion having an inclining direction which applies an upward force on the core-combining member 5 due to the abutment of the boundary line 27 with the external face (inclined face) of the leg portion 13 of the core-combining member 5.

In the first embodiment, as shown in FIG. 1A, the cover member 20 having the above-mentioned characteristic structure is placed on the core-combining member 5 from above so as to be fixed to the substrate 2, so that the core-combining member 5 is urged upward by the cover member 20 so as to form the clearance S between the opposing faces of the substrate 2 and the internal faces 8b of the top portion 8 of the core member 4a. Thus, the core member 4a can be held out of contact with the substrate 2.

The coil apparatus according to the first embodiment is formed as described above. An example of a manufacturing process of the coil apparatus will be simply described. First, similarly to the conventional example, the pair of core members 4a and 4b are respectively arranged on top-face and bottom-face sides of the substrate for mounting electronic components 2; these core members 4a and 4b are held together by the core-combining member 5.

Next, from the topside of the core-combining member 5, the leg portions 22a and 22b of the cover member 20 are respectively inserted into the through-holes for inserting core legs 10a and 10c. Then, as shown in FIG. 1A, the left leg portion 22a of the cover member 20 is inserted at a left position outside the left leg portion 13a of the core-combining member 5 while the right leg portion 22b is inserted at a right position outside the right leg portion 13b, so that bottom ends of the ribs 26 of the leg portions 22a and 22b abut the external side-faces of the leg portions 13a and 13b of the core-combining member 5. In addition, in the first embodiment, since triangular sloping faces 26c are formed on the ribs 26 as shown in FIG. 1D, the leg portions 22a and 22b of the cover member 20 can be smoothly inserted into the through-holes 10a and 10c without being caught at the ribs 26.

As the insertion of the leg portions 22a and 22b of the cover member 20 proceeds, the boundary line 27 (inclined portion) of the cover member 20 comes into contact with the external side-faces of the leg portions 13a and 13b of the core-combining member 5; by the boundary line 27 of the cover member 20, a force is applied to the leg portions 13a and 13b of the core-combining member 5 in an upward direction, so that the core-combining member 5 is raised. As shown in FIG. 1A, the clearance S is thereby formed between the opposing faces of the substrate 2 and the internal faces 8b of the top portion 8 of the core member 4a. After the core-combining member 5 is raised, resulting in a non-contact state between both of the core members 4 and the substrate 2, the cover member 20 is fixed to the substrate 2.

Then, similarly to the conventional example, the core legs 9a, 9b, and 9c of the topside core member 4a are brought into full contact with the core legs 9a, 9b, and 9c of the bottom-side core member 4b by rubbing the cores against each other.

The coil apparatus 1 according to the first embodiment can be constructed as described above.

According to the first embodiment, by raising and holding the core-combining member 5 with the cover member 20, the clearance S is formed between the opposing faces of the core member 4a and the surface of the substrate 2, resulting in a non-contact state between both of the core members 4a and 4b and the substrate 2. Therefore, when the cores are rubbed together during the assembling of the coil apparatus 1, the core members 4a and 4b cannot damage the surface of the substrate 2, so that damage to the protecting member formed on the top surface of the substrate 2 can be prevented, thereby avoiding the problems such as corrosion of a circuit pattern on the substrate 2 and degradation of the withstand-voltage performance. Accordingly, a highly reliable coil apparatus 1 can be provided.

Also, in the first embodiment, as shown in FIG. 1B, since plural ribs 26 are studded on each of the leg portions 22a and 22b at intervals, stability can be improved when the core-combining member 5 is raised and held by the cover member 20.

Furthermore, since the inclined portions (boundary lines) 27 of the ribs 26 abut the external side-faces of the leg portions 13a and 13b of the core-combining member 5 linearly, the contacting area is extremely small, so that the cover member 20 can be attached thereto by a small force, thereby improving assembly efficiency.

A second embodiment will be described below in connection with FIGS. 3A–3D. In the description of the second embodiment, like reference characters designate like portions common to the above-described first embodiment and the redundant description of the common portions is omitted.

Figure 3A:
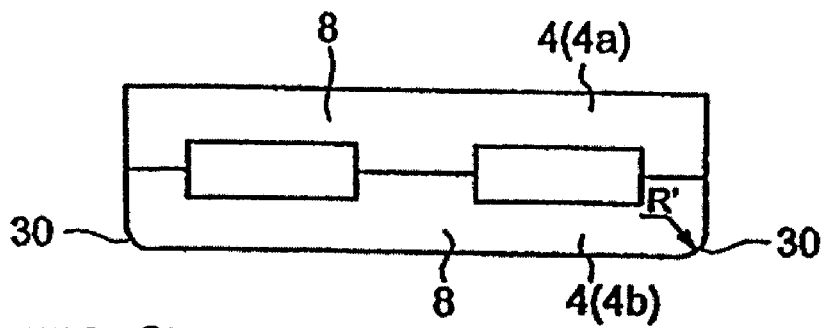
FIGS. 3A, 3B, 3C, 3D and 3E are schematic representations for showing characteristic structures of a coil apparatus according to a second embodiment.
Figure 3B:
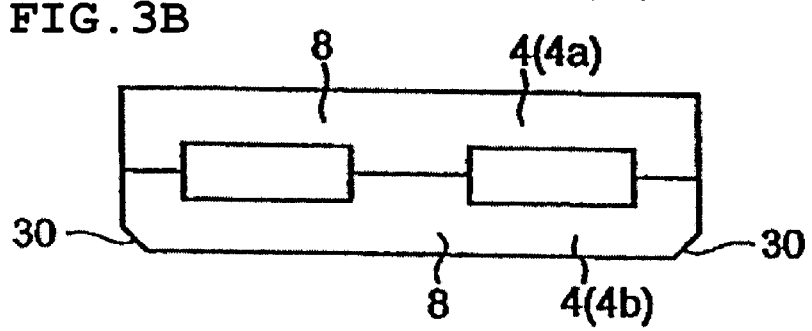
Figure 3E:
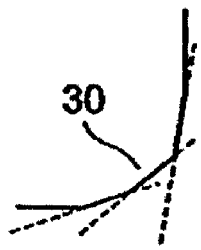
Figure 3C:
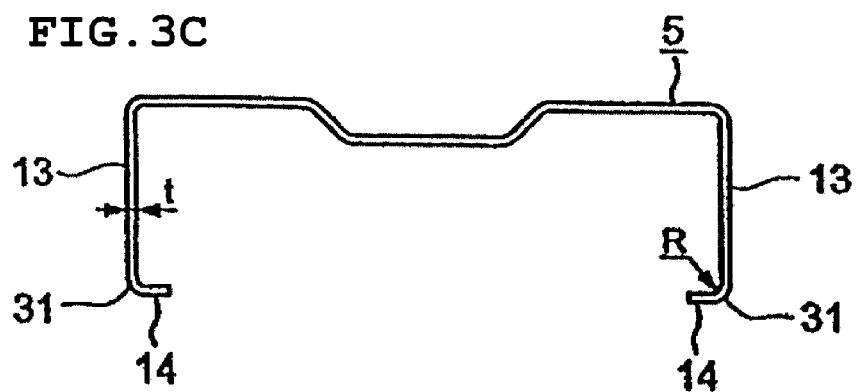
Figure 3D:
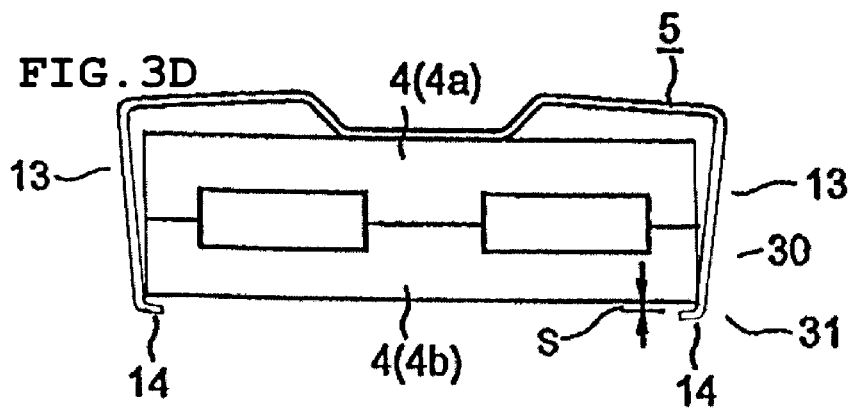

The second embodiment has substantially the same structure as that of the first embodiment; however, a distinguishing feature thereof is that corners 30 of the core member 4b, which correspond to bent corners 31 between the leg portions 13a and 13b and the claw portions 14a and 14b of the core-combining member 5 as shown in FIG. 3D, may be rounded as shown in FIG. 3A or may be beveled as shown in FIG. 3B.

In addition, the core-combining member 5 is formed so as to have a configuration shown in FIG. 3C by bending a metallic plate as mentioned above. The bent corners 31 between the leg portions 13a and 13b and the claw portions 14a and 14b have an appropriate radius of curvature R corresponding to the thickness t of the metallic plate (R≧(t/2), for example) in order to prevent crack development.

Since the core members 4a and 4b are molded by pressing and sintering magnetic-material powder such as ferrite, if the cross-section of the corner 30 of the core member 4 were formed at a right angle, such a corner 30 of the core member 4b would be brought into linear contact with an internal face of the bent corner 31 of the core-combining member 5 at the vertex of the right angle cross-section.

Although such a concentrated linear contact would not greatly interfere with the core members 4a and 4b being held together by the core-combining member 5, the corner 30 might chip off due to a large force applied to the corner 30 of the core member 4b by the core-combining member 5, or a clearance s might be formed between the claw portions 14a and 14b of the core-combining member 5 and the core member 4b as shown in FIG. 3D so that the stability of the core members 4a and 4b would be slightly adversely affected.

Accordingly, in the second embodiment, as described above, the corners 30 of the core member 4b are rounded or beveled, so that almost the entire corner 30 of the core member 4b (if rounded) is brought into face-contact with an internal face of the bent corner 31 of the core-combining member 5, or the corner 30 (if beveled) is brought into face-contact or linear-contact with the internal face of the bent corner 31 at a plurality of spots.

That is, in the second embodiment, when the corner 30 is rounded as shown in FIG. 3A, the corner 30 is formed so as to have a radius of curvature R' which is not smaller than the radius of curvature R of the bent corner 31 of the core-combining member 5 (R'≧R). When the corner 30 is beveled as shown in FIG. 3B, the portion of the corner 30, which corresponds to the rounded portion having the radius of curvature R' as shown in FIG. 3A, is cut from front to back across the side of the core member 4b.

According to the second embodiment, excellent advantages can be obtained just as in the first embodiment; furthermore, as described above, the corners 30 of the core member 4b are rounded or are beveled, so that almost the entire corner 30 is brought into face-contact with an internal face of the bent corner 31 of the core-combining member 5, or the corner 30 is brought into face-contact or linear-contact with the internal face of the bent corner 31 at plural spots, so that the above-mentioned chipping of the corner 30 of the core member 4b can be securely prevented and also the clearance s between the claw portions 14a and 14a of the core-combining member 5 and the core member 4b can be eliminated, enabling the core members 4a and 4b to be effectively held together by the core-combining member 5. This enables the performance reliability of the coil apparatus 1 to be furthermore improved.

The present invention is not limited to the above-described embodiments; various other embodiments can be achieved. For example, in each of the embodiments, the rib 26 has a triangular-pyramid shape; however, it is not limited to the triangular-pyramid shape and various other configurations may be adopted as long as the rib has a portion which is inclined in such a way as to raise the core-combining member 5 by abutting an external side (inclined face) of each of the leg portions 13a and 13b of the core-combining member 5.

Also, in each of the embodiments, there are two ribs 26 formed in each of the leg portions 22a and 22b of the cover member 20; however, only one rib 26 may be formed in each of the leg portions 22a and 22b, or three or more ribs 26 may be formed, that is, the number of ribs 26 is not limited.

Furthermore, in each of the embodiments, on the inside face of each of the leg portions 22a and 22b of the cover member 20, the ribs 26 are formed to inwardly protrude with inclined portions which raise and hold the core-combining member 5; however, for example, the inside face itself of each of the leg portions 22a and 22b may be inclined to raise and hold the core-combining member 5, without having structures like the ribs 26.

Figure 4A:
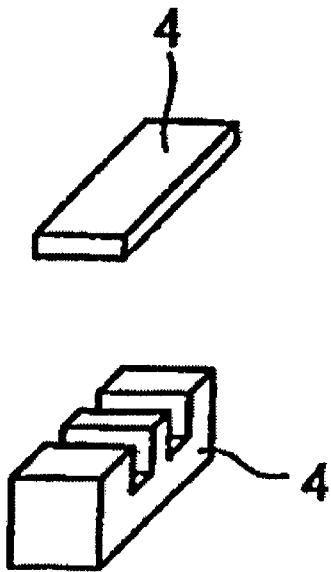
FIGS. 4A, 4B, and 4C are schematic representations for showing a core member according to other modifications.
Figure 4B:
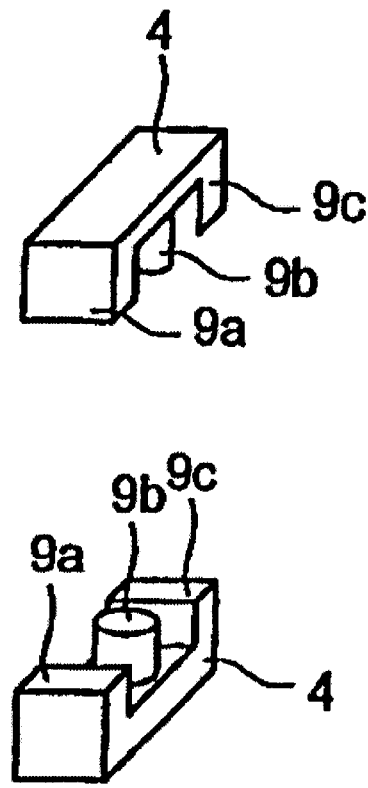
Figure 4C:
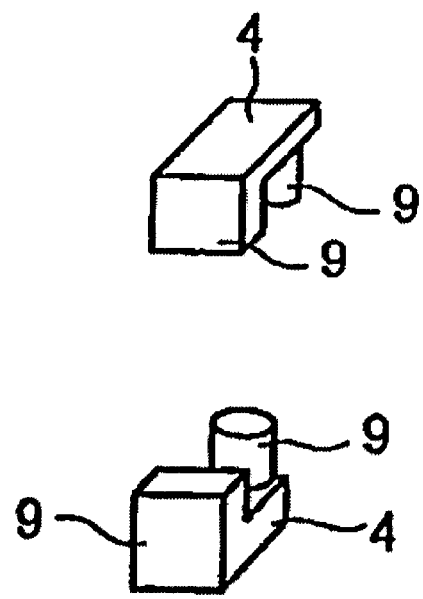

Moreover, in each of the embodiments, the pair of core members 4a and 4b are both E-shaped; however, as shown in FIG. 4A, one of a pair of core members 4 may be E-shaped and the other may be an I-shaped core member having an I-shaped cross-section. As shown in FIG. 4B, an EER-type core member may be used, which has a cylindrical-column-shaped central core leg 9b. Furthermore, as shown in FIG. 4C, a UR-type core member 4 having a U-shaped cross-section may be used, in which one of two core legs 9 is a right prism and the other is a cylindrical column. When the UR-type core member 4 is mounted on the coil pattern section 3, one of two core legs 9 is arranged in the central part of the coil pattern section 3 formed on the substrate 2 for mounting electronic components while the other is arranged outside the coil pattern section 3.

In the second embodiment, when the corner 30 of the core member 4b is beveled, the corner 30 has only one cut face; however, as shown in FIG. 3E for example, the corner 30 may be beveled so as to have plural cut faces. In this case, the shape of the cut faces approaches the rounded shape of the corner 30 having the radius of curvature R' shown in FIG. 3A.

Although the present invention has been described in relation to particular embodiments thereof, many other variations and modifications and other uses will become apparent to those skilled in the art. Therefore, the present invention is not limited by the specific disclosure herein.

What is claimed is:

1. A coil apparatus comprising:

a substrate for mounting electronic components;

a coil pattern formed on the substrate;

a pair of core members mounted on the substrate so as to sandwich a part of the coil pattern therebetween from top and bottom sides of the substrate, at least one of the pair of core members having core legs;

through-holes for inserting the core legs formed in a portion of the substrate inside the coil pattern section and in at least a portion of the substrate outside the coil pattern;

a core-combining member for holding the pair of core members together so that the core members are movable with respect to each other in directions along the substrate, by clamping one core member from the top side of the substrate and the other core member from the bottom side of the substrate, the core-combining member passing from the top to the bottom of the substrate via the through-holes; and a cover member arranged to be fixed to the substrate; wherein the cover member has a surface which holds the core-combining member so as to separate the core members from the substrate resulting in a non-contact state therebetween, by forming a space between opposing faces of the substrate and the core members when held by the core-combining member;

the core-combining member is provided with leg portions which are inserted into the through-holes so as to be arranged toward the outside, to the right or the left, of the right and left core legs, respectively, each leg portion of said core-combining member having an inclined face formed on an external side thereof, the inclined face inclining outwardly so as to become more distant from the core members as the inclined face proceeds from the bottom face toward the top face of the substrate; and the cover member is provided with leg portions which are inserted into the same through-holes at positions outside the leg portions of the core-combining member, each leg portion of the cover member having an inclined portion formed thereon, the inclined portion being oriented so as to separate the core-combining member from the substrate by abutting against the inclined faces of the leg portions of the core-combining member.

2. The coil apparatus according to claim 1, wherein said core-combining member is made of a bent metallic plate including a web portion which is bent to include a depressed portion in a central portion of the web portion, said depressed portion being arranged to abut against a surface of one of said pair of core members.

3. The coil apparatus according to claim 1, where each of said leg portions of said cover member include a claw portion for engaging said substrate.

4. The coil apparatus according to claim 1, wherein said cover member includes at least one substrate-abutting portion for abutting a top surface of said substrate.

5. The coil apparatus according to claim 1, wherein said inclined surface of said cover member is defined by a boundary line between two triangular faces provided on said leg portions of said cover member.

6. A method for manufacturing a coil apparatus comprising the steps of:

arranging a pair of core members, one of said pair of core members on a top face of a substrate for mounting electronic components, the other of said pair of core members on a bottom face of the substrate;

holding the pair of core members together with a core-combining member so as to mount the core members on a coil pattern on the substrate;

holding the core-combining member with a cover member which is fixed to the substrate, whereby the core member is separated from the substrate, resulting in a non-contact state therebetween; and sliding the core member on the top face of the substrate relative to the core member on the bottom face thereof so as to rub a contacting portion of the core member on the top face and a contacting portion of the core member on the bottom face against each other so that the contacting portions between the core member on the top face and the core member on the bottom face are brought into closer contact; wherein the core-combining member is provided with leg portions which are inserted into through-holes provided in the substrate so as to be arranged toward the outside, to the right or the left, of right and left core legs of the pair of core members, respectively, each leg portion having an inclined face formed on an external side thereof, the inclined face inclining outwardly so as to become more distant from the core members as the inclined face proceeds from the bottom face toward the top face of the substrate; and the cover member is provided with leg portions which are inserted into the same through-holes at positions outside the leg portions of the core-combining member, each leg portion of the cover member having an inclined portion formed thereon, the inclined portion being oriented so as to separate the core-combining member from the substrate by abutting against the inclined faces of the leg portions of the core-combining member.

7. The method for manufacturing a coil apparatus according to claim 6, wherein said core-combining member is made of a bent metallic plate including a web portion which is bent to include a depressed portion in a central portion of the web portion, said depressed portion being arranged to abut against a surface of one of said pair of core members.

8. The method for manufacturing a coil apparatus according to claim 6, where each of said leg portions of said cover member include a claw portion for engaging said substrate.

9. The method for manufacturing a coil apparatus according to claim 6, wherein said cover member includes at least one substrate-abutting portion for abutting a top surface of said substrate.

10. The method for manufacturing a coil apparatus according to claim 6, wherein said inclined surface of said cover member is defined by a boundary line between two triangular faces provided on said leg portions of said cover member.

* * * * *